(12) United States Patent
Reif et al.

(10) Patent No.: US 7,064,055 B2
(45) Date of Patent: Jun. 20, 2006

(54) METHOD OF FORMING A MULTI-LAYER SEMICONDUCTOR STRUCTURE HAVING A SEAMLESS BONDING INTERFACE

(75) Inventors: Rafael Reif, Newton, MA (US); Andy Fan, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/655,670

(22) Filed: Sep. 5, 2003

(65) Prior Publication Data
US 2004/0126994 A1    Jul. 1, 2004

Related U.S. Application Data

(60) Provisional application No. 60/437,549, filed on Dec. 31, 2002.

(51) Int. Cl.
H01L 21/4763    (2006.01)

(52) U.S. Cl. .............. 438/618; 438/612; 438/613; 438/615

(58) Field of Classification Search ........... 438/108, 438/612–618; 257/777–779
See application file for complete search history.

(56) References Cited

U.S. PATENT DOCUMENTS

| | | | |
|---|---|---|---|
| 4,313,126 A | 1/1982 | Krumm et al. | |
| 4,402,761 A | 9/1983 | Feist | |
| 4,456,888 A | 6/1984 | Ayasli | |
| 4,599,704 A | 7/1986 | Mazin | |
| 4,939,568 A | 7/1990 | Kato et al. | |
| 4,986,861 A | 1/1991 | Nishida et al. | |
| 5,156,997 A | 10/1992 | Kumar et al. | |
| 5,206,186 A | 4/1993 | Neugebauer et al. | |
| 5,236,118 A | 8/1993 | Bower et al. | |
| 5,270,261 A | 12/1993 | Bertin et al. | |
| 5,370,301 A | 12/1994 | Belcher et al. | |
| 5,391,257 A | 2/1995 | Sullivan et al. | |
| 5,445,994 A | 8/1995 | Gilton | |
| 5,504,376 A | 4/1996 | Sugahara et al. | |
| 5,523,628 A * | 6/1996 | Williams et al. ............ 257/777 |
| 5,563,084 A | 10/1996 | Ramm et al. | |
| 5,669,545 A | 9/1997 | Pham et al. | |

(Continued)

FOREIGN PATENT DOCUMENTS

DE    100 47 963 A 1    3/2001

(Continued)

OTHER PUBLICATIONS

A.Fan et a., "Copper Wafer Bonding", Electrochemical and Solid-State Letters, 2(10) 534-536 (1999).*

(Continued)

Primary Examiner—Donghee Kang
(74) Attorney, Agent, or Firm—Daly, Crowley, Mofford & Durkee, LLP

(57) ABSTRACT

A method of forming a multi-layer semiconductor structure includes providing a first layer of a patterned copper bond film having a first predetermined thickness onto a first surface of a first semiconductor. The method further includes providing a second layer of a patterned copper bond film having a second predetermined thickness onto a first surface of a second semiconductor. The first and second semiconductor structures can be aligned, such that the first and second patterned copper bond films are disposed in proximity. A virtually seamless bond can be formed between the first and second patterned copper bond films to provide the first and second semiconductors as the multi-layer semiconductor structure.

30 Claims, 4 Drawing Sheets

U.S. PATENT DOCUMENTS

| | | | |
|---|---|---|---|
| 5,706,578 | A | 1/1998 | Hubner |
| 5,767,009 | A | 6/1998 | Yoshida et al. |
| 5,821,138 | A | 10/1998 | Yamazaki et al. |
| 5,825,080 | A | 10/1998 | Imaoka et al. |
| 5,902,118 | A | 5/1999 | Hubner |
| 5,904,562 | A | 5/1999 | Nulman |
| 5,923,087 | A | 7/1999 | Suzuki et al. |
| 5,940,683 | A | 8/1999 | Holm et al. |
| 5,985,693 | A | 11/1999 | Leedy |
| 5,998,808 | A | 12/1999 | Matsushita |
| 6,027,958 | A | 2/2000 | Vu et al. |
| 6,441,478 | B1 | 8/2002 | Park |
| 6,465,892 | B1 | 10/2002 | Suga |
| 6,525,415 | B1 | 2/2003 | Koyanagi et al. |
| 6,600,173 | B1 | 7/2003 | Tiwari |
| 6,717,244 | B1 * | 4/2004 | Hikita et al. ............... 257/678 |
| 2002/0050635 | A1 | 5/2002 | Ogura et al. |
| 2002/0074670 | A1 | 6/2002 | Suga |
| 2002/0109236 | A1 | 8/2002 | Kim et al. |
| 2002/0135062 | A1 | 9/2002 | Mastromatteo et al. |
| 2002/0135075 | A1 | 9/2002 | Leedy |
| 2004/0124538 | A1 | 7/2004 | Reif et al. |
| 2004/0126994 | A1 | 7/2004 | Reif et al. |
| 2004/0219765 | A1 | 11/2004 | Reif et al. |

FOREIGN PATENT DOCUMENTS

| | | |
|---|---|---|
| EP | 1 041 624 A1 | 10/2000 |
| EP | 1 151 962 A1 | 7/2001 |
| EP | 1 432 032 A2 | 6/2004 |
| FR | 2 645 681 | 10/1990 |
| WO | WO 02/09182 A1 | 1/2002 |

OTHER PUBLICATIONS

Mark Lapedus, Tezzaron Devises Multi-Wafer Slack for 3-D Chips, Jun. 30, 2003, Naperville, Illinois, p. 1.

Chris Gaither, Intel Set To Unveil Advanced Communications Chip, The Boston Globe, Oct. 15, 2002, pp. 1-3, Boston, Massachusetts.

Peter Clarke, IEDM Late Paper. IBM Shows How to Stack for 3D Circuitry, Silicon Strategies.Com, Nov. 28, 2002, pp. 1-2, London.

TRU-SI Technologies, Through-Silicon Vias, Tru-Si Technologies Home Page, Apr. 7, 2003, p. 1, Sunnyvale, California.

Mark Lapedus, Tezzaron Devises Multi-Wafer Stack for 3-D Chips, Semiconductors EE Times, Jun. 30, 2003, pp. 1-3, Naperville, Illinois.

Osamu Tabata, Anisotropic Etching of Silicon in TMAH Solutions, Toyota Central Research and Development Laboratories, Inc., Feb. 21, 1992, pp. 51-57, Japan.

Philip M. Sailer, Creating 3D Circuits Using Transferred Films, Circuits & Devices, Nov. 1997, pp. 27-30.

Takuji Matsumoto, New Three-Dimensional Wafer Bonding Technology Using the Adhesive Injection Method, Mar., 1998, pp. 1217-1221. Jpn., J. Appl. Phys. vol. 37 (1998).

A. Fan, Copper Wafer Bonding, Electrochemical and Solid-State Letters, 1999, pp. 534-536, Cambridge, Massachusetts.

Arifur Rahman, Wire-Length Distribution of Three-Dimensional Integrated Circuits, 1999, pp. 233-235.

Victor W.C. Chan, Three Dimensional CMOS Integrated Circuits on Large Grain Polysilicon Films, EEE, Hong Kong University of Science and Technology, 2000, pp. 00-161-00-164 Hong Kong.

K.W. Lee, Three-Dimensional Shared Memory Fabricated Using Wafer Stacking Technology, Dept. of Machine Intelligence and Systems Engineering. 2000, pp. 00-165-00-168, Hong Kong.

Kuan-Neng Chen, Microstructure Examination of Copper Wafer Bonding, Microsystem Technology Laoratories, Dec. 20, 2000, pp. 331-335, Cambridge, Massachusetts.

Y. Hayashi, Fabrication of Three Dimensional IC Using "Cumulatively Bonded IC" (CUBIC) Technology Symposium on VLSI Technology, 1990, pp. 95-96.

PCT/US/03/41514 International Search Report Jun. 17, 2004.

PCT/US 03/41407. International Search Report, Sep. 15, 2004.

* cited by examiner

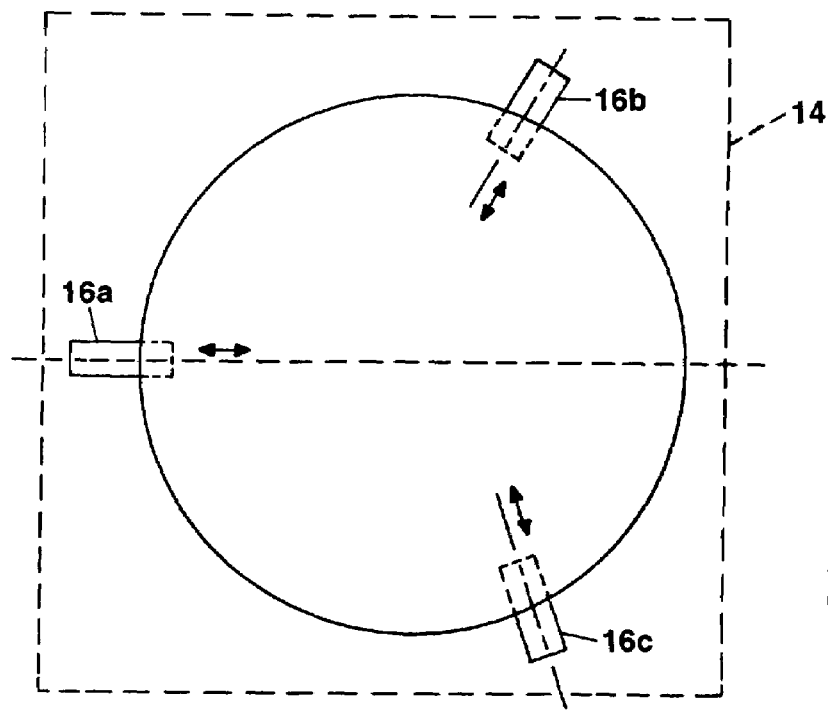
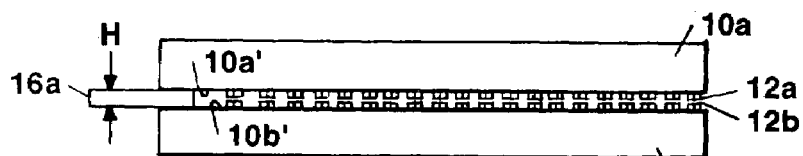
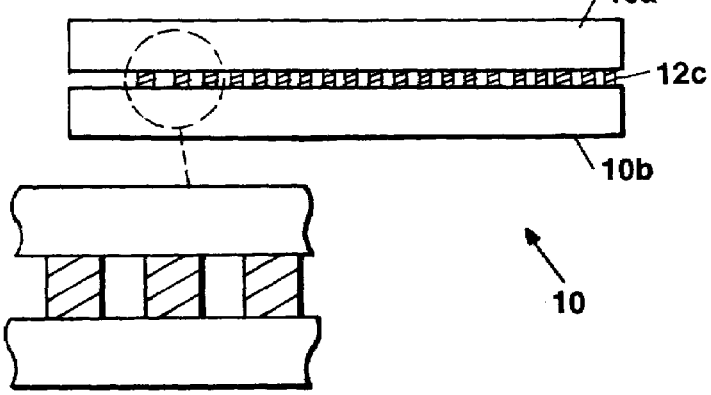

US 7,064,055 B2

METHOD OF FORMING A MULTI-LAYER SEMICONDUCTOR STRUCTURE HAVING A SEAMLESS BONDING INTERFACE

CROSS REFERENCE TO RELATED APPLICATION

This application claims the benefit under 35 U.S.C. §119 (e) of U.S. Provisional Application No. 60/437,549, filed on Dec. 31, 2002, entitled, A Multi-Layer Integrated Semiconductor Structure, which is hereby incorporated by reference in its entirety.

STATEMENT REGARDING FEDERALLY SPONSORED RESEARCH

This invention was made with government support under a subcontract between Georgia Institute of Technology and M.I.T., under Prime Grant Number MDA972-99-1-0002, awarded by the Defense Advanced Research Projects Agency. The government has certain rights in the invention.

FIELD OF THE INVENTION

The present invention relates generally to a method of forming a multi-layer semiconductor structure and, more specifically, to a method of forming an integrated multi-layer semiconductor structure that includes a number of semiconductor structures bonded together by one or more seamless conductive bonding interfaces, which are adapted to provide a strong and reliable bond, as well as, to provide electrical communications between the number of semiconductor structures.

BACKGROUND

A number of individual integrated circuit structures can be aligned and bonded together to form an interconnected multi-layer semiconductor structure, which is commonly referred to as a three-dimensional semiconductor structure. Typically, the number of individual integrated circuits can be bonded together to form the three-dimensional semiconductor structure using various adhesives, as are known.

One potential problem that may occur in bonding a first individual integrated circuit structure to a second individual integrated circuit structure, for example, is related to the formation of a bonding structure seam or more simply, a "bonding seam" at the interface between the bonded first and second individual integrated circuit structures. The bonding seam is a seam or delineation between adhesive materials which are applied to each opposing surface of the first and second individual integrated circuit structures prior to bonding. In other words, the bonding seam delineates bonding adhesive material associated with the first individual integrated circuit structure from bonding adhesive material associated with the second individual integrated circuit structure. A number of small air gaps can be formed on the bonding seam, which may significantly reduce the strength of the bond formed between the first and second integrated circuit structures. Furthermore, the number of small air gaps formed on the bonding seam can also have an adverse impact on electrical properties formed between the bonded first and second integrated circuit structures.

Therefore, it would be desirable to provide a method of forming a seamless coupling or bonding structure for coupling a number of individual integrated circuit structures of a multi-layer semiconductor structure, which has a relatively high bonding strength.

SUMMARY OF THE INVENTION

A method of forming a multi-layer semiconductor structure is set forth in accordance with principles of the present invention. The method of forming the multi-layer semiconductor structure includes providing, to a first predetermined thickness, a first patterned bond film onto a first surface of a first semiconductor structure. A second patterned bond film is provided, to a second predetermined thickness, onto a first surface of a second semiconductor structure. The first patterned bond film of the first semiconductor structure and the second patterned bond film of the second semiconductor structure are aligned using a fixture. Thereafter, a bond is formed between the first and second patterned bond films to provide the first and second semiconductor structures as the multi-layer semiconductor structure.

In one aspect of the present invention, forming the bond includes heating or annealing the first and second patterned bond films to a predetermined temperature. Further, a force is applied to at least one of the first and the second semiconductor structures for a predetermined period of time to maintain contact between the first and second patterned bond films for the predetermined period of time.

In one aspect of the present invention, aligning the first and second semiconductor structures using the fixture includes disposing the first and second semiconductor structures on the fixture. While the first and second semiconductor structures are disposed on the fixture, a predetermined space is maintained between the first and second semiconductor structures using a plurality of spacers, which are disposed between the first and second semiconductor structures.

In another aspect of the present invention, forming the bond includes disposing the fixture and the first and second semiconductor structures in a bonding chamber. Thereafter, undesired impurities are purged from the bonding chamber. A first predetermined force is applied to the first and the second semiconductor structures for a first predetermined time interval. While the first predetermined force is applied, the plurality of spacers are removed from between the first and second semiconductor structures. The first and second semiconductor structures are heated at a first predetermined rate to a predetermined bonding temperature. A second predetermined force is applied to the first and the second semiconductor structures for a second predetermined time interval while heating the first and second semiconductor structures at the first predetermined rate. A third predetermined force is applied to the first and second semiconductor structures for a third predetermined time interval after reaching the predetermined bonding temperature.

In an aspect of the present invention, after purging undesirable impurities from the bonding chamber, such as oxygen and/or water vapor, the method further includes evacuating the bonding chamber to a predetermined pressure. In another aspect, a non-oxidizing ambient can be formed in the bonding chamber, after purging undesirable impurities from the bonding chamber. In yet another aspect, a non-oxidizing ambient that includes hydrogen can be formed in the bonding chamber.

The method can further include cooling the first and second semiconductor structures. Thereafter, the multi-layer semiconductor structure can be heated at a predetermined temperature for a fourth predetermined time interval.

In an aspect of the present invention, providing the first patterned bond film includes providing at least one of a metallic bond film, such as a copper bond film, or an alloy bond film. Similarly, providing the second patterned bond film includes providing at least one of a metallic bond film, such as a copper bond film, or an alloy bond film.

In an aspect of the present invention, providing the first patterned bond film onto the first surface of the first semiconductor structure includes providing the first patterned bond film onto the first surface of a first semiconductor wafer structure. Similarly, providing the second patterned bond film onto the first surface of the second semiconductor structure includes providing the second patterned bond film onto the first surface of a second semiconductor wafer structure.

In another aspect of the present invention, providing the first patterned bond film onto the first surface of the first semiconductor structure includes providing the first patterned bond film onto a first surface of a first semiconductor die structure. Similarly, providing the second patterned bond film onto the first surface of the second semiconductor structure includes providing the second patterned bond film onto a first surface of a second semiconductor die structure. In another aspect, providing the second patterned bond film onto the first surface of the second semiconductor structure includes providing the second patterned bond film onto at least a portion of a first surface of a second semiconductor wafer structure.

Another method of forming a multi-layer semiconductor structure is set forth in accordance with principles of the present invention. The method of forming the multi-layer semiconductor structure includes retaining a first semiconductor structure to a second semiconductor structure using a fixture, such that the first and second semiconductor structures are separated by a predetermined distance. A number of spacer flaps are employed to maintain the predetermined distance or spacing between the first and second semiconductor structures, while the first and second semiconductor structures are retained on the fixture. In one aspect, retaining may include pressing and/or clamping the first semiconductor structure to the second semiconductor structure using the fixture.

The fixture, which includes at least the first and second semiconductor structures, is disposed in a bonding chamber. The bonding chamber is purged to remove undesirable impurities, such as oxygen and/or water vapor. A first predetermined force is applied to the first and the second semiconductor structures for a first predetermined time interval. While the first and second semiconductor structures are under the first predetermined force, the spacer flaps are removed from between the first and second semiconductor structures. A second predetermined force is applied to the first and the second semiconductor structures for a second predetermined time interval while heating the first and second semiconductor structures at a first predetermined rate. A third predetermined force is applied to the first and second semiconductor structures for a third predetermined time interval. The first and second semiconductor structures are subsequently cooled. The method further includes heating the multi-layer semiconductor structure at a predetermined temperature for a fourth predetermined time interval.

In one aspect of the present invention, after the bonding chamber is purged the method further includes evacuating the bonding chamber to a predetermined pressure. In another aspect, after the bonding chamber is purged the method further includes forming a non-oxidizing ambient in the bonding chamber. In yet another aspect, after the bonding chamber is purged the method further includes forming a non-oxidizing ambient in the bonding chamber, which includes hydrogen.

In an aspect of the present invention, retaining the first semiconductor structure to the second semiconductor structure includes retaining a first semiconductor wafer structure to a second semiconductor wafer structure. Similarly, in another aspect, retaining the first semiconductor structure to the second semiconductor structure includes retaining a first semiconductor die structure to a second semiconductor die structure. In a further aspect, retaining the first semiconductor structure to the second semiconductor structure includes retaining a first semiconductor die structure to at least a portion of a second semiconductor wafer structure.

In another method of forming a multi-layer semiconductor structure in accordance with the present invention, the method includes providing, to a first predetermined thickness, a first patterned bond film onto a first surface of a first semiconductor structure. The method further includes providing, to a second predetermined thickness, a second patterned bond film onto a first surface of a second semiconductor structure. The first patterned bond film of the first semiconductor structure and the second patterned bond film of the second semiconductor structure are aligned with predetermined portions of a third semiconductor structure. A bond is formed between the first, second and third semiconductor structures using the first and second patterned bond films to provide the multi-layer semiconductor structure.

In an aspect of the present invention, forming the bond between the first, second and third semiconductor structures includes forming a bond between first, second and third semiconductor die elements to provide the multi-layer semiconductor structure. Furthermore, forming the bond between the first, second and third semiconductor die elements includes forming a bond between the first semiconductor die element having a first geometry and/or shape, the second semiconductor die element having a second geometry and/or shape and the third semiconductor die element having a third geometry and/or shape.

BRIEF DESCRIPTION OF THE DRAWING

The foregoing and other objects of this invention, the various features thereof, as well as the invention itself, can be more fully understood from the following description, when read together with the accompanying drawings in which:

FIG. 2 is a top plan view of a bonding chuck employed in the process for fabricating the multi-layer semiconductor structure;

FIG. 3 is an exemplary cross-sectional view of a top semiconductor structure and a bottom semiconductor structure, which are retained on the bonding chuck of FIG. 2;

FIG. 4 is an exemplary cross-sectional view of the multi-layer semiconductor structure.

DETAILED DESCRIPTION OF THE INVENTION

Figure 1:
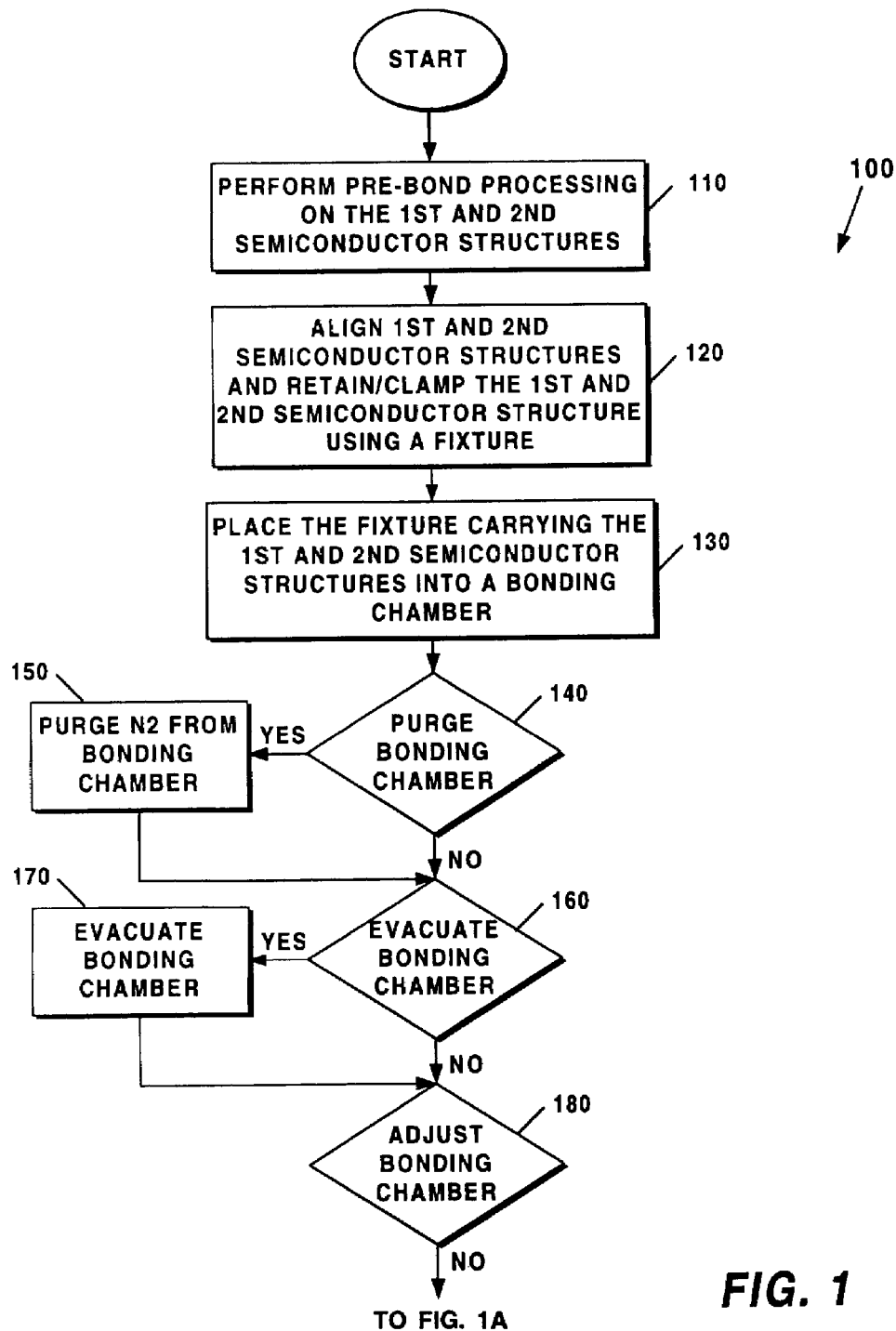
FIGS. 1 and 1A are a series of flow charts illustrating a process for fabricating a multi-layer semiconductor structure.
Figure 1A:
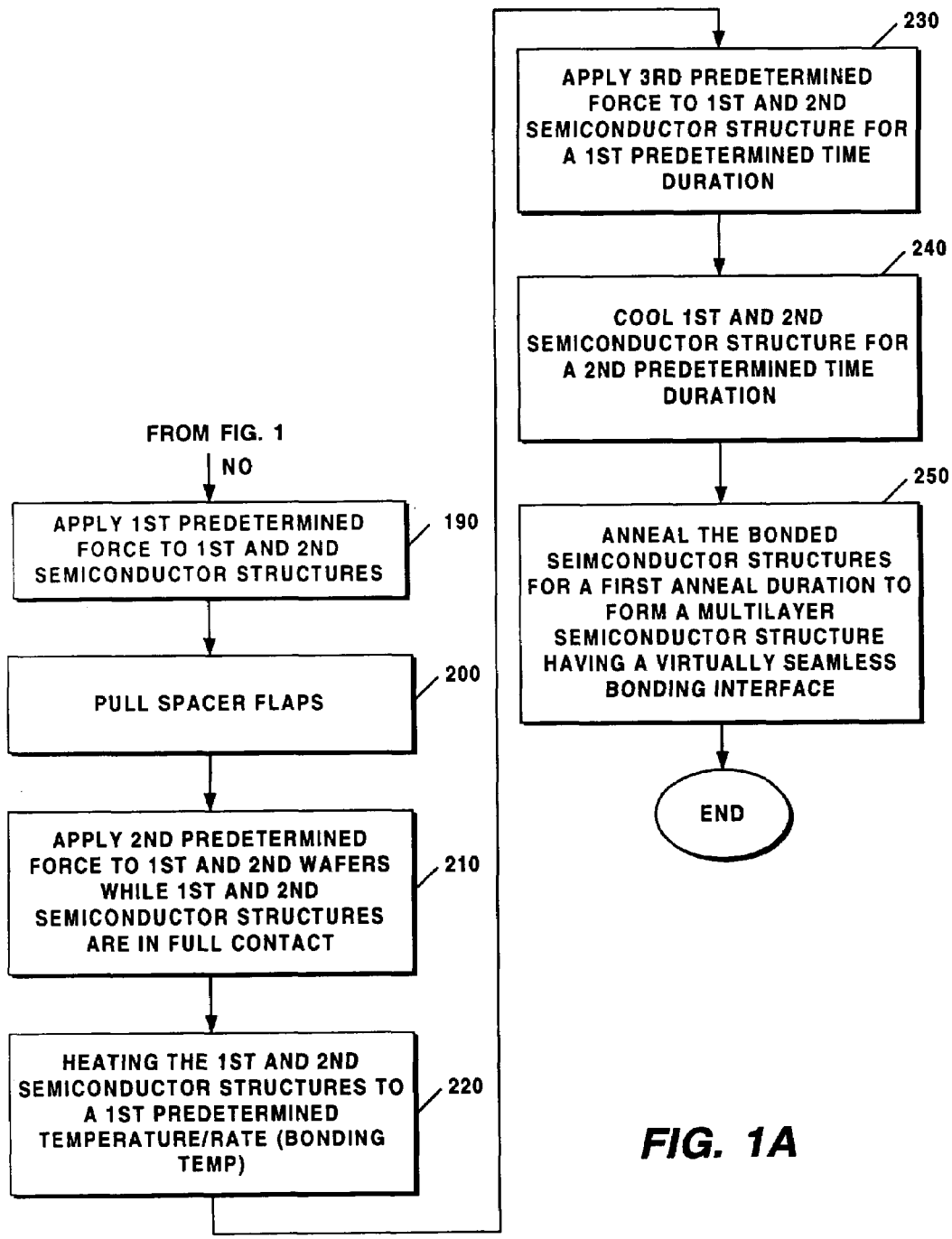

Referring collectively to FIGS. 1–4, in which like elements are provided having like reference designations throughout the several views, an exemplary method 100 of forming a multi-layer semiconductor structure 10 (FIG. 4) is set forth in accordance with principles of the present invention. At step 110, the method includes performing pre-bond processing on at least a first semiconductor structure 10a (FIG. 3) and a second semiconductor structure 10b (FIG. 3). Although not specifically shown, the pre-bond processing can include a number of preliminary operations, such as disposing a layer of conductive material over a first surface 10a' (FIG. 3) of the first semiconductor structure 10a, as well as, disposing a layer of conductive material over a first surface 10b' (FIG. 3) of the second semiconductor structure 10b. In an embodiment, the layer of conductive material disposed on each of the first 10a and second 10b semiconductor structures can be disposed by any thin film deposition technique, such as sputtering, evaporation or chemical vapor deposition techniques and can include materials, such as copper, copper-alloy or other conductive metals or alloys.

The first semiconductor structure 10a can thereafter be subjected to a photolithographic process for forming a first predetermined pattern of conductive material 12a (FIG. 3) (which is hereinafter referred to as a "first conductive bonding interface 12a") on the first surface 10a' of the first semiconductor structure 10a. Similarly, the second semiconductor structure 10b can also be subjected to the photolithographic process for forming a second predetermined pattern of conductive material 12b (FIG. 3) (which is hereinafter referred to as a "second conductive bonding interface 12b") on the first surface 10b' of the second semiconductor structure 10b.

The pre-bond processing can further include subjecting the first 10a and second 10b semiconductor structures to an oxidation reduction process, such as dipping the first 10a and second 10b semiconductor structures in an oxidation reduction solution. In an embodiment, the oxidation reduction solution can include a 1:1 (by volume) $H_2O:HCl$. The first 10a and second 10b semiconductor structures can be dipped in the oxidation reduction solution for approximately 30-seconds followed by being rinsed in De-Ionized (DI) water and then spin dried. The oxidation reduction process is operative to substantially remove any native oxide located on the first 12a and second 12b conductive bonding interfaces.

At step 120, the bonding procedure starts by retaining the first 10a and second 10b semiconductor structures in a bonding chuck 14, as shown in FIG. 2. The first 10a and second 10b semiconductor structures are retained in the bonding chuck 14 (FIG. 2) in a face-to-face orientation and separated by a predetermined space "H" defined by a plurality of spacer flaps 16a, 16b, 16c (collectively referred to as spacer flaps 16a–16c), as shown in FIGS. 2 and 3. The face-to-face orientation is defined as orienting the first 10a and second 10b semiconductor device layers in the bonding fixture 14 so that the first 12a and second 12b conductive bonding interfaces respectively defined on each of the first 10a and second 10b semiconductor structures face each other. In an embodiment, the predetermined space "H" defined by the plurality of spacer flaps 16a–16c can be approximately 30-microns.

It should be understood that the predetermined space "H" defined by the plurality of spacer flaps 16a–16c can be adjusted to a number of other values that permit the spacer flaps 16a–16c to maintain a substantially uniform spacing between the first 12a and second 12b conductive bonding interface layers respectively located on the first 10a and second 10b semiconductor structures. It should be further understood that the spacer flaps 16a–16c can include a number of other shapes, such as wedges or shim structures, which are adapted for maintaining a substantially uniform spacing between the first 12a and second 12b conductive bonding interface layers respectively located on the first 10a and second 10b semiconductor structures.

The method 100 further includes aligning the first and second semiconductor structures 10a, 10b so that predetermined portions of the first conductive bonding interface 12a located on the first semiconductor structure 10a substantially align with predetermined portions of the second conductive bonding interface 12b located on the second semiconductor structure 10b. After alignment, the first 10a and second 10b semiconductor structures are retained (e.g., clamped or pressed) together to securely retain them on the bonding chuck 14.

At step 130, the bonding chuck 14, which carries the first 10a and second 10b semiconductor structures, can be placed in a bonding chamber (not shown). At step 140, it can be determined whether to purge $N_2$ or other impurities from a portion of the bonding chamber proximate to the bonding chuck 14. If it is determined to purge $N_2$ or other impurities from the portion of the bonding chamber proximate to the bonding chuck 14, at step 140, the bonding chamber is controlled to purge a first predetermined amount of $N_2$ or other undesirable impurities from the bonding chamber, at step 150. At step 160, it can be determined whether to evacuate the portion of the bonding chamber proximate to the bonding chuck 14 to a first predetermined pressure. If it is determined to evacuate the bonding chamber to the first predetermined pressure, the bonding chamber is controlled to evacuate the bonding chamber to the first predetermined pressure. In an embodiment, the first predetermined pressure can be approximately $10^{-2}$ torr.

It should be understood that the bonding chamber can also be controlled to form a non-oxidizing ambient. Furthermore, the bonding chamber can also be controlled to form a non-oxidizing ambient, which includes hydrogen.

At step 180, a determination can be made whether to further adjust the bonding chamber by further purging and/or evacuating the bonding chamber. If it is determined to further purge the bonding chamber, the method 100 is redirected to step 150 and the above-described process of purging the bonding chamber is repeated. If it is determined to further evacuate the bonding chamber, the method 100 is redirected to step 170 and the above-described process of evacuating the bonding chamber is repeated. In an embodiment, it can be determined to redirect the method 100 to step 150 to further control the bonding chamber to purge a second predetermined amount of $N_2$ or other impurities from the region of the bonding chamber proximate to the bonding chuck.

Further in this embodiment, it can be determined to redirect the method 100 to step 170 to further control the bonding chamber to further evacuate the bonding chamber to a second predetermined pressure in the region of the bonding chamber proximate to the bonding chuck 14. In an embodiment, the second predetermined pressure can be approximately $10^{-3}$ torr.

At step 190, a first predetermined force can be downwardly applied to the first and second semiconductor structures. In one embodiment, the first predetermined force is applied to a top central region of the first semiconductor structure 10a (e.g opposite the first conductive interface 12a). In another embodiment, the first predetermined force is provided as a distributed force, which is applied at the center and periphery of the first semiconductor structure 10a. In yet another embodiment, the first predetermined force is provided as a non-uniform distributed force, e.g., more force is applied at the center of the first semiconductor structure 10a than at the periphery of the first semiconductor structure 10a or visa-versa. While applying the first predetermined force to the first semiconductor structure 10a, the plurality of spacer flaps 16a–16c can be simultaneously pulled or disengaged from their original position, as shown in step 200. As discussed above, the spacer flaps maintain a substantially uniform spacing between the first 12a and second 12b conductive bonding interfaces located on the first 10a and second 10b semiconductor structures. Once the spacer flaps are pulled from their original position, they no longer engage the first 10a and second 10b semiconductor structures and the first semiconductor structure 10a is forced downwardly until the first conductive interface 12a located on the first semiconductor structure 10a contacts the second conductive interface 12b located on the second semiconductor structure 10b (e.g., the bottom conductive semiconductor structure 10b).

In an embodiment, the first predetermined force is approximately equal to a 300-mbar force. In the embodiment in which the first predetermined force is applied to the top central region of the first semiconductor structure 10a, the force is approximately equal to a 300 mbar force, which is evident from the description hereinabove. However, the first predetermined force can be applied in a variety of different manners to any part of the first semiconductor structure 10a. It should thus be appreciated that different forces may be used to couple the first and second semiconductor structures 10a, 10b. The force that is selected in any particular application should be selected to permit the spacer flaps to be removed without substantially changing the alignment of the first and second semiconductor structures 10a, 10b.

At step 210, while the first 12a and second 12b conductive interfaces respectively located on the first 10a and second 10b semiconductor structures are in a contact relationship, a second predetermined downwardly directed force can be applied to a region of the first 10a or top semiconductor structure, which force is translated to the second 10b or bottom semiconductor structure for further coupling the first 10a and second 10b semiconductor structures, via the first 12a and second 12b conductive bonding interfaces. In an embodiment, in which the force is applied to a top central region of the first seminconductor structure 10a, the second predetermined downwardly directed force can be provided as approximately a 1000-mbar force. It should be appreciated, however, that as in the case with the first predetermined force, the second predetermined force may be applied to the first semiconductor structure 10a in a variety of different manners (e.g., distributed uniform force, distributed non-uniform force or the like, as well as, to any part of the first semiconductor structure 10a.)

At step 220, the first 10a and second 10b semiconductor structures are heated to a first predetermined temperature and/or at a first predetermined rate until reaching a predefined bonding temperature. In an embodiment in which the bond film is copper, bonding begins at ambient temperature and the bonding temperature increases at a first predetermined rate of approximately 40° C./min. At step 230, after the first 10a and second 10b semiconductor structures are heated to reach the predefined bonding temperature, a downwardly directed third predetermined force is applied to the first 10a or top semiconductor structure for a first predetermined duration. In one embodiment, the third predetermined force is applied to a top central region of the first semiconductor structure 10a. In another embodiment, the third predetermined is provided as a distributed force, which is applied at the center and periphery of the first semiconductor structure 10a. In yet another embodiment, the third predetermined force is provided as a non-uniform distributed force e.g., more force is provided to the center of the first semiconductor structure 10a than to the periphery of the first semiconductor structure 10a, or visa-versa.

The downwardly directed third predetermined force applied to the first semiconductor structure 10a is translated to the second 10b or bottom semiconductor structure for yet further coupling the first 10a and second 10b semiconductor structures. In an embodiment, the third predetermined force is approximately a 4000-mbar force and the first predetermined duration is approximately 30 minutes.

Optionally at step 240, the first 10a and second 10b semiconductor structures can be cooled for a second predetermined duration of time. At this instant, the bonded first 10a and second 10b semiconductor structures form a bonded semiconductor structure 10, which is similar to that shown in FIG. 4. In an embodiment, the second predetermined duration of time for cooling is approximately two hours. If the optional step 240 of cooling the first 10a and second 10b semiconductor structures is not elected, the method 100 is accelerated to step 250, as described in detail below.

At step 250, the bonded semiconductor structure, which is similar to that shown in FIG. 4, is heated or annealed in a diffusion furnace having an $N_2$ ambient and at a first anneal-temperature for a first anneal-duration. The process of annealing the integrated semiconductor structure, as described above, reduces or eliminates any seam that delineates between the first conductive bonding interface 12a and the second conductive bonding interface 12b respectively located on the first 10a and second 10b semiconductor structures to form the multi-layer semiconductor structure 10, as shown in FIG. 4.

In an embodiment, the first anneal-temperature is approximately 400° C. and the first anneal-duration is approximately 30 minutes. It should be understood that a number of other anneal-temperatures and anneal-durations can be employed to form the multi-layer semiconductor structure 10. For example, the first anneal-temperature can be reduced to approximately 350° C. and the first anneal-duration can be increased to approximately 60 minutes.

Generally, the bonding temperature and bonding duration for bonding the first and second semiconductor structures 10a, 10b, ranges from approximately 250° C. to approximately 400° C. for approximately 30 minutes. Further, the annealing temperature and annealing duration for annealing the first and second semiconductor structures 10a, 10b, ranges from approximately 250° C. to approximately 400° C. for approximately 30 minutes to approximately 90 minutes.

It should be understood that the above described method is fully scaleable and can be repeated a number of times using a plurality of other semiconductor structures including semiconductor structures having a variety of different shapes and sizes including regular or irregular shapes and sizes and/or multi-layer semiconductor structures to form other multi-layer semiconductor structures having a greater number of semiconductor structure layers.

It should also be understood that a plurality of other forces, heating temperatures, annealing temperatures and durations can be employed in the method 100 of the present invention to compensate for characteristics, dimensions, materials or other attributes of the various elements incorporated on the multi-layer semiconductor structure 10.

There are many advantages to the multi-layer semiconductor structure 10 of the present invention in that there is virtually no seam or delineation between the first 12a and second 12*b* conductive bonding interfaces respectively located on the first 10*a* and second 10*b* semiconductor structures, which significantly increases the bonding strength between the first 10*a* and second 10*b* semiconductor structures of the multi-layer semiconductor structure 10. In addition, the virtually seamless first 12*a* and second 12*b* conductive bonding interfaces have a relatively low impedance, which can significantly improve electrical signal characteristics for signals communicated between the first 10*a* and second 10*b* semiconductor structures, via the first 12*a* and second 12*b* conductive bonding interfaces.

Figure 5:
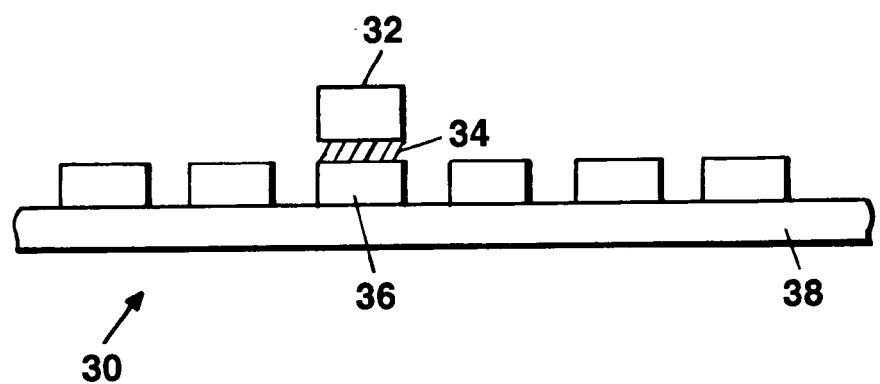
FIG. 5 is an embodiment of a die-to-wafer structure fabricated according to the present invention.

Referring to FIG. 5, an embodiment of a die-to-wafer structure 30 is provided, which includes a first die 32 disposed over and coupled to a second die 36, via a conductive bond film 34. The bond film 34 may be provided as any of the types described above in conjunction with FIGS. 1–4 and serves to bond the first die 32 to the second die 36, which is provided as part of a larger integrated circuit or wafer 38. Thus, to provide the die-to-wafer structure 30, the bond film 34 can be first applied to a wafer (not shown) of which the first die 32 is a part. While the first die 32 is part of the wafer, the bond film can be patterned or otherwise disposed on the die 32 using a variety of different techniques, including those techniques described above in conjunction with FIGS. 1–4. Once the bond film is disposed on the wafer including the first die 32, the first die 32 is cut or otherwise separated from the wafer.

Alternatively, the bond film 34 can be first disposed on die 36 and then the first die 32 and second die 36 are aligned. In one embodiment, the first die 32 is then aligned in a predetermined position on the wafer 38. In the example of FIG. 5, the first die 32 is aligned over the second die 36, which is provided as part of the wafer 38. It should be appreciated that while aligning the first die 32 over the second die 36, it is necessary to secure the wafer 38 or the die 32 so that the first die 32 can be properly aligned with the second die 36. It should also be appreciated that portions of the bond film 34 can be disposed on each of the first and second dies 32, 36 prior to aligning and bonding the first and second dies 32, 36, as described above.

Once the first die 32 and the second die 36 are properly aligned, at least the first die 32 is exposed to a method for bonding the first and second dies 32, 36, via the bond film 34, which is similar to that described above with respect to FIG. 1. The particular temperatures and pressures used for bonding the first and second dies 32, 36 will depend upon a variety of factors, including but not limited to, the specific material from which the bond film 34 is provided, as well as the size, shape and material from which the first die 32 is provided, as well as the size, shape and material from which the second die 36 is provided.

Figure 6:
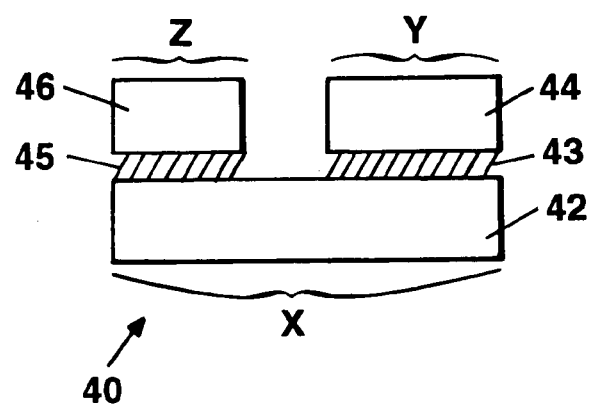
FIG. 6 is an embodiment of a multiple die-to-die structure fabricated according to the present invention.

Referring to FIG. 6, an embodiment of a multiple die-to-die structure 40, is provided, which includes a first die 42 bonded to a second die 44, via first and third bond films 43*a*, 45, respectively associated with each of the first and second dies 42, 44. The multiple die-to-die structure 40 further includes a third die 46 coupled to the first die 42, via second and fourth bond films 43*b*, 47, respectively associated with the first and third dies 42, 46. The first, second and third dies 42, 44, 46 may be bonded together using the first, second, third and fourth bond films 43*a*, 43*b*, 45, 47, as described above, using a method similar to that shown and described above with respect to FIGS. 1 and 5.

It should be understood that the multiple die-to-die structure 40, including the first, second and third dies 42, 44, 46, is provided for illustration purposes and that the multiple die-to die structure 40 can be expanded to include a plurality of semiconductor die structures (not shown). Furthermore, the plurality of die structures, which may each include various die shapes, sizes and/or geometries, can be arranged and bonded to form another multiple die-to-die structure (not shown) having a number of layers, such as three or more layers. In an embodiment of the multiple die-to-die structure 40 of FIG. 6, for example, the first die 42 can include a first shape or geometry "X", the second die 44 can include a second shape or geometry "Y" and the third die 46 can include a third shape or geometry "Z."

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto. All references and publications cited herein are expressly incorporated herein by reference in their entirety.

What is claimed is:

1. A method of forming a multi-layer semiconductor structure, comprising:
    (a) providing, to a first predetermined thickness, a first patterned bond film onto a first surface of a first semiconductor structure;
    (b) providing, to a second predetermined thickness, a second patterned bond film onto a first surface of a second semiconductor structure;
    (c) aligning the first patterned bond film of the first semiconductor structure and the second patterned bond film of the second semiconductor structure; and
    (d) forming a bond between the first and second patterned bond films to provide the first and second semiconductor structures as the multi-layer semiconductor structure wherein forming the bond comprises:
        applying a first predetermined force to the first and the second semiconductor structures for a first predetermined time interval;
        heating the first and second semiconductor structures at a first predetermined rate to a predetermined bonding temperature;
        applying a second predetermined force to the first and the second semiconductor structures for a second predetermined time interval while heating the first and second semiconductor structures at the first predetermined rate; and
        applying a third predetermined force to the first and second semiconductor structures for a third predetermined time interval after reaching the predetermined bonding temperature.

2. The method of claim 1, wherein
applying the third predetermined force comprises one of:
    applying the third predetermined force to a top central region of a first one of the first and second semiconductor structures;
    applying the third predetermined force as a distributed force applied at a center and periphery regions of a first one of the first and second semiconductor structures;
    applying the third predetermined force as a non-uniform distributed force such that more force is provided to a center region than to a periphery region of a first one of the first and second semiconductor structures; and
    applying the third predetermined force as a non-uniform distributed force such that more force is provided to a periphery region than to a center region of a first one of the first and second semiconductor structures.

3. The method of claim 1, wherein aligning the first and second semiconductor structures includes:
- disposing the first and second semiconductor structures on a fixture; and
- maintaining a predetermined space between the first and second semiconductor structures using a plurality of spacers disposed between die first and second semiconductor structures.

4. The method of claim 3, wherein forming the bond includes:
- disposing the fixture and the first and second semiconductor structures in a bonding chamber;
- purging undesired impurities from the bonding chamber;
- applying the first predetermined force to the first and the second semiconductor structures for the first predetermined time interval;
- removing the spacers from the first and second semiconductor structures while the first and second semiconductors are under the first predetermined force;
- heating the first and second semiconductor structures at a first predetermined rate to a predetermined bonding temperature;
- applying the second predetermined force to the first and the second semiconductor structures for the second predetermined time interval while heating the first and second semiconductor structures at the first predetermined rate; and
- applying the third predetermined force to the first and second semiconductor structures for the third predetermined time interval after reaching the predetermined bonding temperature.

5. The method of claim 4, further including evacuating the bonding chamber to a predetermined pressure.

6. The method of claim 4, further including forming a non-oxidizing ambient in the bonding chamber.

7. The method of claim 4, further including forming a non-oxidizing ambient in the bonding chamber and including hydrogen.

8. The method of claim 4, further comprising cooling the first and second semiconductor structures.

9. The method of claim 8, further comprising heating the multi-layer semiconductor structure at a predetermined temperature for a fourth predetermined time interval.

10. The method of claim 9, wherein heating the multi-layer semiconductor structure further includes annealing the multi-layer semiconductor structure.

11. The method of claim 1, wherein providing the first patterned bond film includes providing at least one of a metallic bond film or an alloy bond film.

12. The method of claim 11, wherein the metallic bond film includes copper.

13. The method of claim 1, wherein providing the second patterned bond film includes providing at least one of a metallic bond film or an alloy bond film.

14. The method of claim 13, wherein the metallic bond film includes copper.

15. The method of claim 1, wherein providing the first patterned bond film onto the first surface of the first semiconductor structure includes providing the first patterned bond film onto a first surface of a first semiconductor wafer structure.

16. The method of claim 1, wherein providing the second patterned bond film onto the first surface of the second semiconductor structure includes providing the second patterned bond film onto a first surface of a second semiconductor wafer structure.

17. The method of claim 1, wherein providing the first patterned bond film onto the first surface of the first semiconductor structure includes providing the first patterned bond film onto a first surface of a first semiconductor die structure.

18. The method of claim 1, wherein providing the second patterned bond film onto the first surface of the second semiconductor structure includes providing the second patterned bond film onto a first surface of a second semiconductor die structure.

19. The method of claim 1, wherein providing the first patterned bond film onto the first surface of the first semiconductor structure includes providing the first patterned bond film onto a first surface of a first semiconductor die structure and providing the second patterned bond film onto the first surface of the second semiconductor structure includes providing the second patterned bond film onto at least a portion of a first surface of a semiconductor wafer structure.

20. A method of forming a multi-layer semiconductor structure, comprising:
- (a) retaining a first semiconductor structure to a second semiconductor structure such that the first and second semiconductor structures are separated by a predetermined distance;
- (b) disposing the first semiconductor structure to a second semiconductor structure in a bonding chamber;
- (c) purging undesirable impurities from the bonding chamber;
- (d) applying a first predetermined force to the first and the second semiconductor structures for a first predetermined time interval;
- (e) applying a second predetermined force to the first and the second semiconductor structures for a second predetermined time interval while heating the first and second semiconductor structures at a first predetermined rate; and
- (f) applying a third predetermined force to the first and second semiconductor structures for a third predetermined time interval.

21. The method claim 20, further including:
- (g) cooling the first and second semiconductor structures.

22. The method of claim 20, wherein retaining comprises:
- clamping the first semiconductor structure to the second semiconductor structure using a fixture; and
- inserting one or more spacers between the first and second semiconductor structures to provide the predetermined spacing.

23. The method of claim 20 wherein retaining comprises:
- providing a force against at least one of the first and second semiconductor structures to maintain the first semiconductor structure the predetermined distance from the second semiconductor structure.

24. The method of claim 20, further including:
- heating the multi-layer semiconductor structure at a predetermined temperature for a fourth predetermined time interval.

25. The method of claim 24, wherein heating the multi-layer semiconductor structure includes annealing the multi-layer semiconductor structure for the fourth predetermined time interval.

26. The method of claim 20, further including evacuating the bonding chamber to a predetermined pressure.

27. The method of claim 20, further including forming a non-oxidizing ambient in the bonding chamber.

28. The method of claim 20, further including forming a non-oxidizing ambient in the bonding chamber and including hydrogen.

29. The method of claim 20, wherein retaining the first semiconductor structure to the second semiconductor structure includes retaining a first semiconductor wafer structure to a second semiconductor wafer structure.

30. The method of claim 20, wherein retaining the first semiconductor structure to the second semiconductor structure includes retaining a first semiconductor die structure to a second semiconductor die structure.

* * * * *

UNITED STATES PATENT AND TRADEMARK OFFICE
CERTIFICATE OF CORRECTION

PATENT NO. : 7,064,055 B2  Page 1 of 1
APPLICATION NO. : 10/655670
DATED : June 20, 2006
INVENTOR(S) : Reif et al.

It is certified that error appears in the above-identified patent and that said Letters Patent is hereby corrected as shown below:

Column 1, line 5 delete "CROSS REFERENCE TO RELATED APPLICATION" and replace with --CROSS REFERENCE TO RELATED APPLICATIONS--.

Column 3, line 60 delete "purged the" and replace with --purged, the--.

Column 3, line 62 delete "purged the" and replace with --purged, the--.

Column 3, line 65 delete "purged the" and replace with --purged, the--.

Column 7, line 2 delete "visa-versa." and replace with --vice-versa.--.

Column 7, lines 65-66 delete "third predetermined is" and replace with --third predeterminded force is--.

Column 8, line 5 delete "visa-versa." and replace with --vice-versa.--.

Column 12, line 38 delete "21. The method claim 20," and replace with --21. The method of claim 20,--.

Signed and Sealed this

Twenty Second Day of April, 2008

JON W. DUDAS
*Director of the United States Patent and Trademark Office*